United States Patent [19]
Cho

[11] Patent Number: 6,153,928
[45] Date of Patent: *Nov. 28, 2000

[54] SUBSTRATE FOR SEMICONDUCTOR PACKAGE, FABRICATION METHOD THEREOF, AND STACKED-TYPE SEMICONDUCTOR PACKAGE USING THE SUBSTRATE

[75] Inventor: Jae Won Cho, Choongcheongbuk-Do, Rep. of Korea

[73] Assignee: Hyuandai Electronics Industries Co., Ltd., Kyoungki-do, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/857,462

[22] Filed: May 16, 1997

[30] Foreign Application Priority Data

May 17, 1996 [KR] Rep. of Korea ................... 96/16646

[51] Int. Cl.[7] ................................................. H01L 23/02
[52] U.S. Cl. .................. 257/686; 257/690; 257/692; 257/700; 257/724; 361/730; 361/735; 361/761; 174/260; 174/261
[58] Field of Search .......................... 257/686, 678, 257/685, 684, 688, 692, 723, 724, 698, 693, 666, 690, 700; 361/729, 730, 735, 761, 792; 174/260, 261

[56] References Cited

U.S. PATENT DOCUMENTS

| | | | |
|---|---|---|---|
| 5,241,456 | 8/1993 | Marcinkiewicz et al. | 257/686 |
| 5,432,681 | 7/1995 | Linderman | 257/686 |
| 5,631,497 | 5/1997 | Miyano et al. | 257/686 |
| 5,633,530 | 5/1997 | Hsu | 257/685 |
| 5,723,900 | 3/1998 | Kojima et al. | 257/686 |
| 5,798,564 | 8/1998 | Eng et al. | 257/686 |
| 5,926,376 | 7/1999 | Cho | 361/761 |
| 6,020,629 | 2/2000 | Farnworth et al. | 257/686 |

FOREIGN PATENT DOCUMENTS 1-283973   11/1989   Japan .
4-127461    4/1992   Japan .

*Primary Examiner*—John Guay
*Assistant Examiner*—Alonzo Chambliss

[57] ABSTRACT

A substrate for a semiconductor package, a fabrication method for the substrate, thereof and a stacked-type semiconductor package using the substrate, and a method of making the package are disclosed. The substrate includes: an insulator having top and bottom surfaces, there being upper and lower recesses respectively formed in the top and bottom surfaces of the insulator; plural first upper and lower conductive lines respectively formed at least in part on exposed surface of the upper and lower recesses; and plural second upper and lower conductive lines respectively formed at least in part on the top and bottom surfaces and connected with corresponding ones of the first upper and lower conductive lines, respectively, the second upper and lower conductive lines extending outwardly from the upper and lower recesses, respectively.

22 Claims, 8 Drawing Sheets

US 6,153,928

SUBSTRATE FOR SEMICONDUCTOR PACKAGE, FABRICATION METHOD THEREOF, AND STACKED-TYPE SEMICONDUCTOR PACKAGE USING THE SUBSTRATE

FIELD OF THE INVENTION

The present invention relates to a substrate for a semiconductor package, a fabrication method thereof and a stacked-type semiconductor package using the substrate, and more particularly, to an improved substrate, a fabrication method thereof, and a stacked-type semiconductor package which achieve high integration and a thinning and a lightening of a semiconductor package in the top and bottom surfaces of the substrate by forming recesses for mounting semiconductor chips and by stacking such semiconductor packages, respectively.

BACKGROUND OF THE INVENTION

Recently, with the rapid development of semiconductor technology, efforts have been made to mount as many semiconductor chips as possible in a given area. As an example, a resin sealed-type semiconductor package in which two semiconductor chips are mounted is illustrated in FIG. 1.

FIG. 1 is a longitudinal cross-sectional view showing the construction of the resin sealed-type semiconductor package according to the conventional art. As shown in this drawing, the resin sealed-type semiconductor package includes: first and second semiconductor chips 1, 1' each disposed to have their chip pads (not illustrated) facing each other with a space therebetween; bumps 3, 3' formed on each chip pad of the first and second semiconductor chips 1, 1', respectively; a plurality of first internal leads 4 one end of each of which is connected to a corresponding bump 3 of the first semiconductor chip 1; external leads 5 extended from the other end of the first internal leads 4; a plurality of second internal leads 4' one end of each of which is connected to a corresponding bump 3' of the second semiconductor chip 1' and the other end of each of the second internal leads 4' is connected with a corresponding one of the first internal leads 4; and a molding unit 6 sealing the first and second semiconductor chips 1, 1' and the first and second internal leads 4, 4'.

The fabrication of the conventional resin sealed-type semiconductor package having the above-described construction will now be described in detail.

The first internal leads 4 are attached (using the bumps 3) to each corresponding pad (not illustrated) formed on the first semiconductor chip 1. The second internal leads 4' are attached (using the bumps 3') to the corresponding pads formed on the second semiconductor chip 1'. According to the bump bonding method: the bumps 3, 3' are located on each pad of the first and second semiconductor chips 1, 1', respectively; the first and second internal leads 3, 3' are attached to the upper surfaces of the bumps 4, 4'; and heat is applied thereto to bond the pads, the bumps 3, 3' and the internal leads 4, 4' together.

Next, the first and second internal leads 4, 4' are respectively attached to the first and second semiconductor chips 1, 1'. The second internal leads 4' of the second semiconductor chip 1' are located on the corresponding first internal leads 4 of the first semiconductor chip 1. Then, using a laser, a bonding process is performed to attach the internal leads 4, 4' to each other. Then, a predetermined area, in which are located the first and second semiconductor chips 1, 1' and the first and second internal leads 4, 4', is sealed with an epoxy resin to form the molding unit 6. The external leads 5 are formed to extend or protrude from the first leads 4 out of the molding unit 6, according to the purpose of a user. This completes the formation of the resin sealed-type semiconductor package.

However, there are some problems with the resin sealed-type semiconductor package. There is a limit to the mountable number of semiconductor chips. The semiconductor package cannot be stacked for use. Moreover, the internal leads are bonded to pads of the semiconductor chips using the bump bonding method, which is an exacting process in comparison with the widely used wire bonding method and incurs a high production cost.

SUMMARY OF THE INVENTION

Accordingly, it is an object of the present invention to provide an improved substrate for a semiconductor package and a fabrication method thereof in which two semiconductor chips are mounted in a single package, and thereby to provide a stacked-type semiconductor package which is capable of achieving a high integration and a thinning and lightening of the package. This package can be stacked with other such semiconductor packages using the substrate.

To achieve the above object, there is provided an insulating substrate having top and bottom surfaces, upper and lower recesses respectively formed in the top and bottom surfaces of the insulating substrate, a plurality of first upper and lower conductive lines respectively formed at least in part on exposed surface of the upper and lower recesses, and a plurality of second upper and lower conductive lines respectively formed at least in part on the top and bottom surfaces and connected with corresponding ones of the first upper and lower conductive lines, respectively, the second upper and lower conductive lines extending outwardly from the upper and lower recesses, respectively.

The insulating substrate is ceramic or plastic, and at least one alignment hole is formed in the insulating substrate. The first upper conductive lines can be electrically connected to the corresponding first lower conductive lines.

To achieve the above object, there is also provided an improved a method for fabricating a substrate for a semiconductor chip package according to the present invention which includes forming a first insulating layer having upper and lower surface, forming first upper and lower conductive lines at least in part on said upper and lower surfaces of said first insulating layer, respectively, forming upper and lower second insulating layers on said first upper and lower conductive lines and said upper and lower surfaces of said first insulating layer, respectively, forming second upper and lower conductive lines at least in part on said upper and lower second insulating layers, electrically connecting corresponding ones of said first and second conductive lines, and forming upper and lower recesses in said upper and lower second insulating layers such that said first upper and lower conductive lines are exposed.

According to the purpose of the user, after forming the first conductive lines on the upper and lower portions, the process of electrically connecting the first conductive line patterns on the upper and lower portions optionally can be carried out according to the application to which the substrate will ultimately be directed. At least one alignment hole penetrating the insulating layers is formed.

To achieve the above objects, there is further provided a stacked type semiconductor chip package, comprising: a insulating substrate according to the present invention, as discussed above; first and second semiconductor chips respectively mounted in said upper and lower recesses; third conductive lines electrically connecting said first and second semiconductor chips to said first upper and lower conductive lines, respectively; and a sealant in said upper and lower recesses for sealing said first upper and lower conductive lines, said semiconductor chips and said third conductive lines, respectively.

In the stacked-type package, the second conductive lines can be selectively connected together, respectively.

The foregoing and other objectives of the present invention will become more apparent from the detailed description given hereinafter. It should be understood, however, that the detailed description and specific examples, while indicating preferred embodiments, are given by way of illustration only, because various changes and modifications within the spirit and scope of the invention will become apparent to those skilled in the art from this detailed description and specific examples.

BRIEF DESCRIPTION OF THE DRAWINGS

The present invention will become more fully understood from the detailed description given hereinbelow and the accompanying drawings which are given by way of illustration only, and thus are not limitative of the present invention, wherein:

FIGS. 2A through 2C-2 are views showing a substrate for a semiconductor package according to an embodiment of the present invention, wherein FIG. 2A is a plan view, FIG. 2B is a bottom surface view, and FIGS. 2C-1 and 2C-2 are longitudinal cross-sectional views of a semiconductor package taken along a line similar to line II-I–II-I in FIG. 2A;

FIGS. 3A through 3G are longitudinal cross-sectional views and FIGS. 3A-1 and 3A-2 are a top and a bottom plan view all showing a fabrication method for a substrate for a semiconductor package according to an embodiment of the present invention;

DETAILED DESCRIPTION OF THE INVENTION

Referring to the accompanying drawings, a substrate for a semiconductor package and a fabrication method, and a stacked type semiconductor package using the substrate according to the present invention will now be described in detail.

Figure 1:
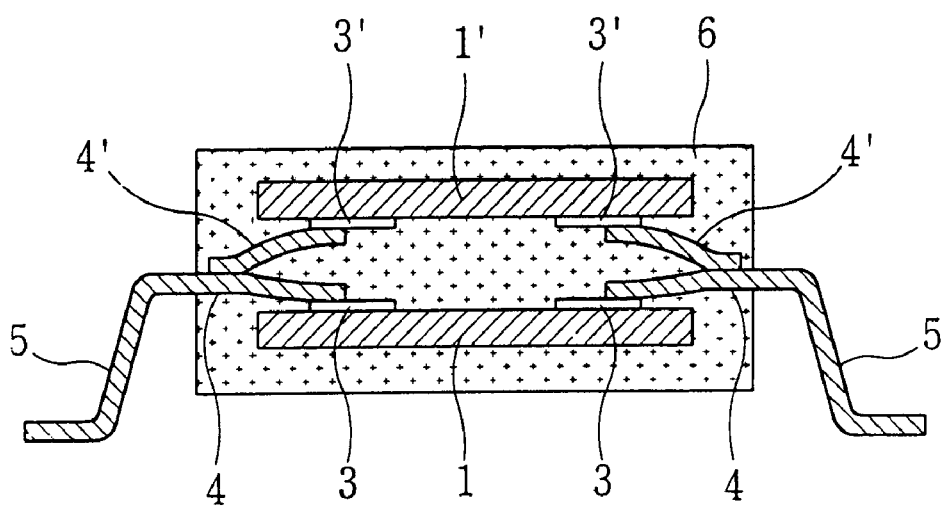
FIG. 1 is a longitudinal cross-sectional view showing the construction of a resin sealed-type semiconductor package according to the conventional art.
Figure 2A:
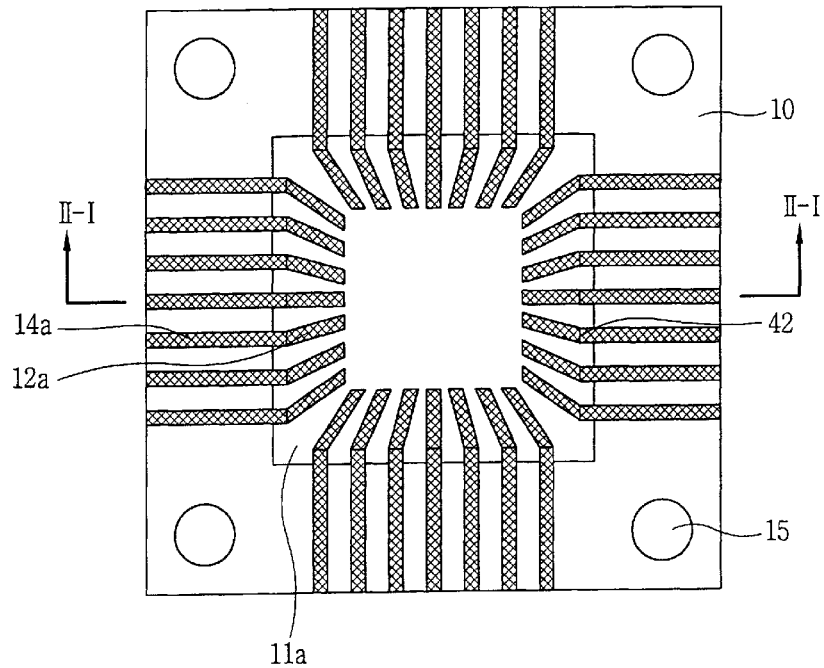
Figure 2B:
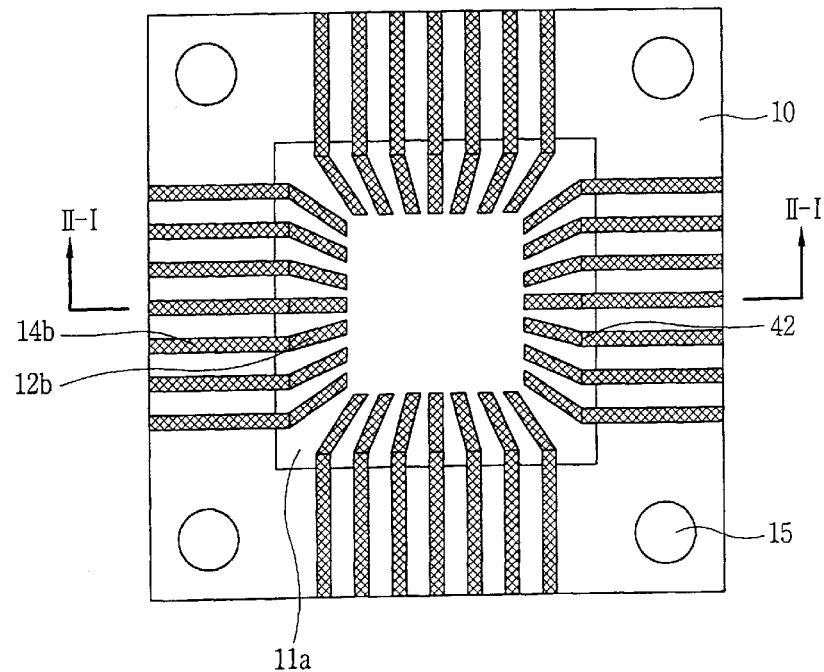
Figures 1, 2C:
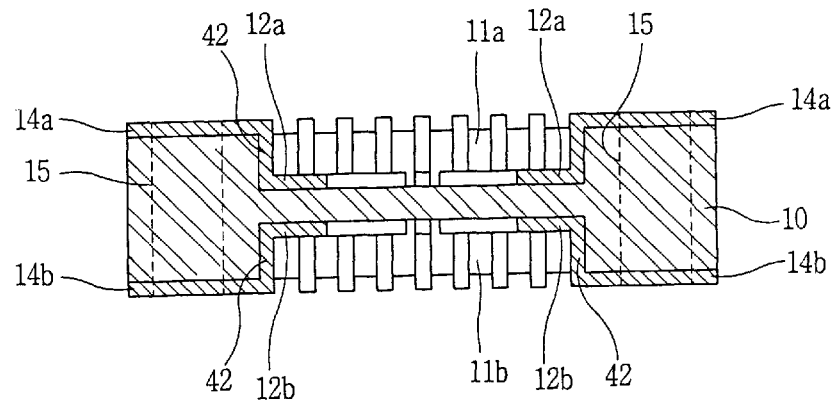
Figures 2, 2C:
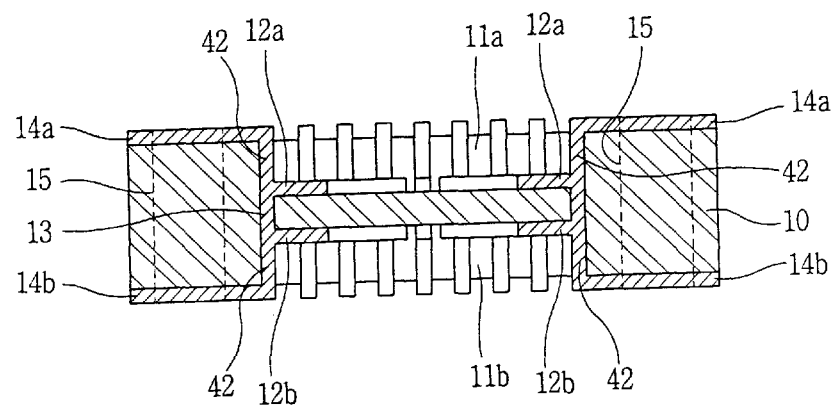

FIGS. 2A through 2C-2 are views showing a substrate for a semiconductor package according to an embodiment of the present invention, wherein FIG. 2A is a top plan view. FIG. 2B is a bottom plan view. FIGS. 2C-1 and 2C-2 are longitudinal cross-sectional views of alternative embodiments of the package taken along a line similar to the line II-I–II-I in FIG. 2A.

As shown in FIGS. 2A and 2B, upper and lower cavities 11a, 11b are formed in a central portion of top and bottom surfaces of an insulator 10 serving as a substrate. The insulator 10 is formed of a ceramic or a plastic insulating material.

A plurality of first upper conductive lines 12a are arranged so as to be spaced at a predetermined interval on the bottom surface of the upper cavity or recess 11a. A plurality of first lower conductive lines 12b are arranged so as to be spaced at a predetermined interval on the upper surface of the lower cavity or recess 11b. The first lower conductive lines 12b are symmetric with the first upper conductive lines 12a.

Here, as shown in FIG. 2C-1, the first upper and lower conductive lines 12a, 12b can be formed to be electrically isolated by the insulator 10 (i.e., without the plug 13 of FIG. 2C-2). Alternatively, as shown in FIG. 2C-2, the first upper and lower conductive lines 12a, 12b can be formed to be electrically connected. The latter is done by forming through-holes completely penetrating the insulator 10 and filling the through-holes with a conductive material or plug 13.

On the top surface of the insulator 10, there are a plurality of second upper conductive lines 14a, each of which is connected to an outer end of a corresponding first upper conductive line 12a. The upper second lines 14a extend outwardly to the outside edge of the top surface of the insulator 10 and are arranged to have a predetermined space therebetween. On the bottom surface of the insulator 10, There is a plurality of second lower conductive lines 14b, each of which is connected to an outer end of a corresponding first lower conductive line 12b. The lower second lines 14b extend outwardly to the outside edge of the bottom surface of the insulator 10 and are arranged to have a predetermined space therebetween. The lower second conductive lines 14a are arranged to be, e.g., symmetric with the second upper conductive lines 14a.

That is, as shown in FIGS. 2A and 2B, the first and second upper conductive lines 12a, 14a, and the first and second lower conductive lines 12b, 14b are symmetrically formed on the top and bottom surfaces of the insulator 10, respectively. The first upper and lower conductive lines 12a, 12b and the second upper and lower conductive lines 14a, 14b are formed of highly conductive metal material, such as aluminum, lead, copper or tungsten.

Alignment holes 15, which vertically penetrate the insulator 10 are formed at the four corners of the insulator 10. The alignment holes are formed so as to facilitate aligning each package when stacking the semiconductor package according to the present invention.

Figure 3A:
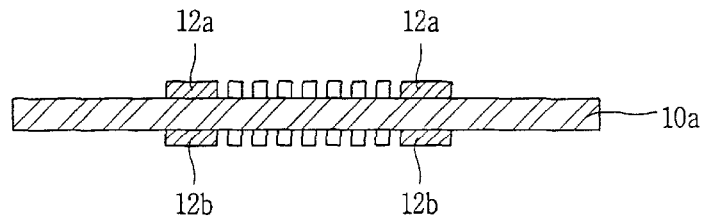
Figures 1, 3A:
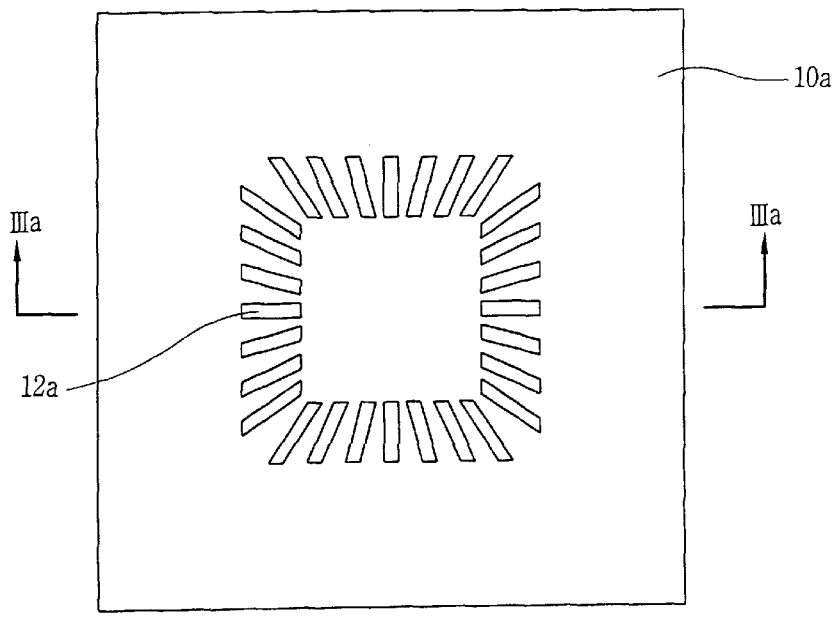
Figures 2, 3A:
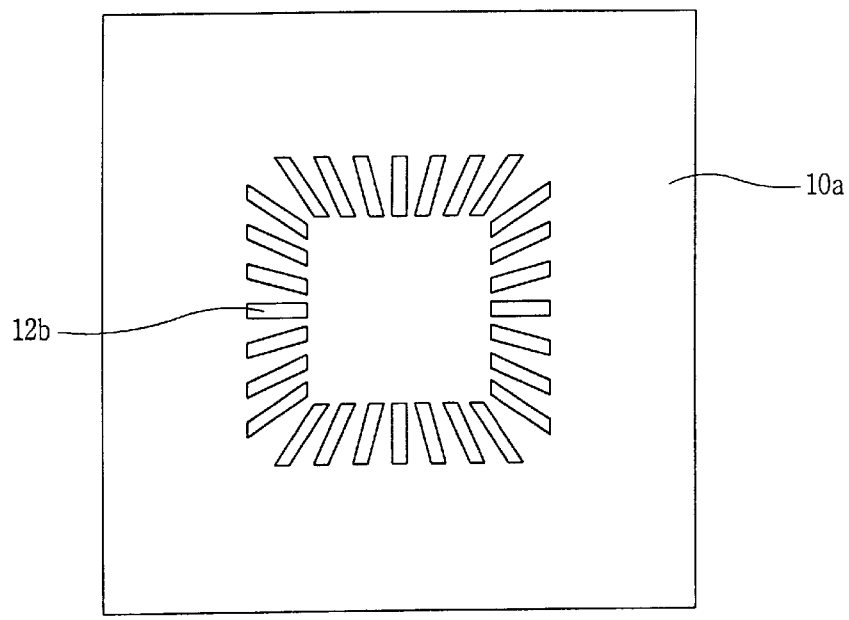
Figure 3B:
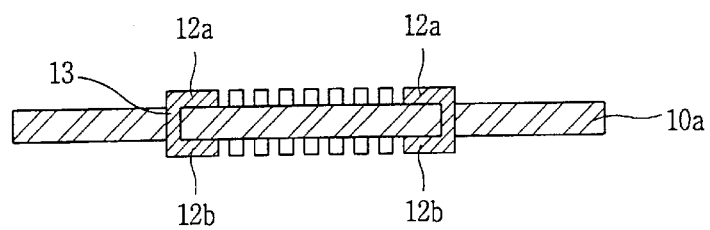

FIGS. 3A and 3B are longitudinal cross-sectional views and FIGS. 3A-1 and 3A-2 are a top and a bottom plan view showing a fabrication method to form a substrate for a semiconductor package according to an embodiment of the present invention. With reference to these drawings, the fabrication of a substrate according to the present invention will now be described in detail.

FIG. 3A is a plan view of the substrate according to the present invention and FIGS. 3A-1 and 3A-2 are top and bottom surface views of the substrate according to the present invention. In FIGS. 3A, 3A-1 and 3A-2, patterns of upper and lower first conductive lines 12a, 12b are formed on the top and bottom surfaces of a first insulating layer 10a which is formed, e.g., of a ceramic or a plastic. The patterns of the first upper and lower conductive lines 12a, 12b are formed by forming a conductive metal layer on the first insulating layer 10a using, e.g., photolithography. As for the patterns of the first upper and lower conductive lines 12a, 12b, a plurality of first conductive lines 12a, 12b are arranged to have a predetermined interval therebetween relative the periphery of a semiconductor chip (not illustrated). This is so that when the semiconductor chips are mounted on a central portion of the top and bottom surfaces of the insulating layer 10a, there well be alignment between the leads of the chips of the first lines 12a, 12b. This is a desirable method but is not limitative.

After forming the patterns of the first upper and lower conductive lines 12a, 12b, as shown in FIG. 3B, the optional through-holes are formed to vertically and completely penetrate the insulating layer 10a. These holes are filled with a conductive material such as aluminum, lead, copper, or tungsten to form the plug 13, so that the corresponding patterns of the first upper and lower conductive lines 12a, 12b are electrically connected, respectively. According to the process for connecting the first upper and lower conductive lines 12a, 12b using the through-holes, before forming the patterns of the first upper and lower conductive lines 12a, 12b, the through-holes can be formed in the locations where the patterns are to be formed. Then the patterns of the first upper and lower conductive lines 12a, 12b are formed on the first insulating layer 10a. Thereby, the first upper and lower conductive lines 12a, 12b are electrically connected more easily via the through-holes.

It should be noted that the corresponding patterns of the first upper and lower conductive lines can be electrically connected to (using the optional conductive plug 13), or isolated from, one another according to the intended usage of the substrate of the present invention, which depends on the user's appropriate application. That is, if the first upper and lower conductive lines 12a, 12b are to be respectively electrically isolated from one another, the above-described process of connecting the first upper and lower conductive lines via the through-holes can be omitted.

Figure 3C:
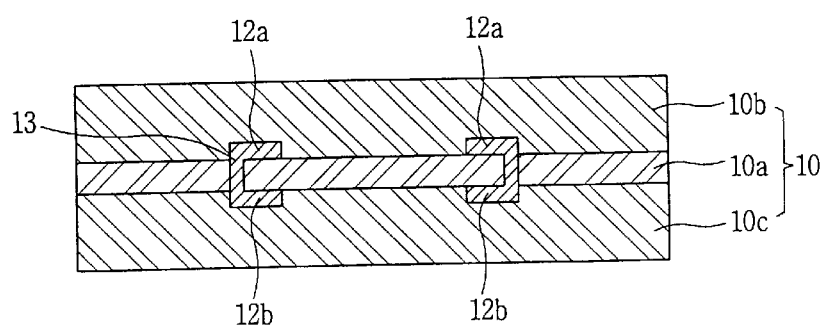

Then, as shown in FIG. 3C, second upper and lower insulating layers 10b, 10c are formed, respectively, on the top and bottom surfaces of the first insulating layer 10a on which the patterns of the first upper and lower conductive lines 12a, 12b are formed. The second upper and lower insulating layers 10b, 10c are formed, e.g., of a ceramic or a plastic material identical to the first insulating layer 10a. Here, when the first insulating layer 10a and the second upper and lower insulating layer 10b, 10c are formed of a ceramic, the insulating layers 10a, 10b, 10c are stacked and then heated at about 1000~1500° C. for a length of time necessary to melt a sufficient amount of the material so that the insulating layers 10a and 10b stick together, and 10a and 10c stick together. This fuses or attaches the layer together to form a single insulator body 10.

Figure 3D:
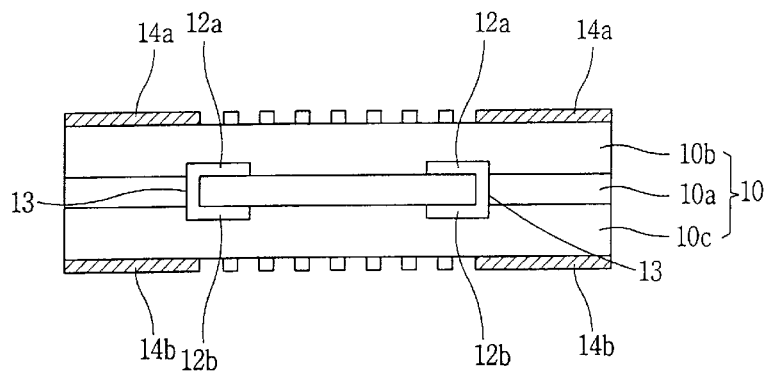

Next, as shown in FIG. 3D, the patterns of the second upper and lower conductive lines 14a, 14b are formed on the second upper and lower insulating layers 10b, 10c, respectively. The patterns of the second upper and lower conductive lines 14a, 14b are made by forming a conductive metal layer on the second insulating layers 10b, 10c, e.g., by photolithography in a manner similar to how the first conductive lines 12a, 12b are formed. The second upper and lower conductive lines 14a, 14b are extended to the outside edge of the top and bottom surfaces of the second upper and lower insulator 10b, 10c, respectively, from the positions at which the corresponding first upper and lower conductive lines 12a, 12b are formed. The lines 14a, 14b are arranged to have a predetermined spacing therebetween.

Figure 3E:
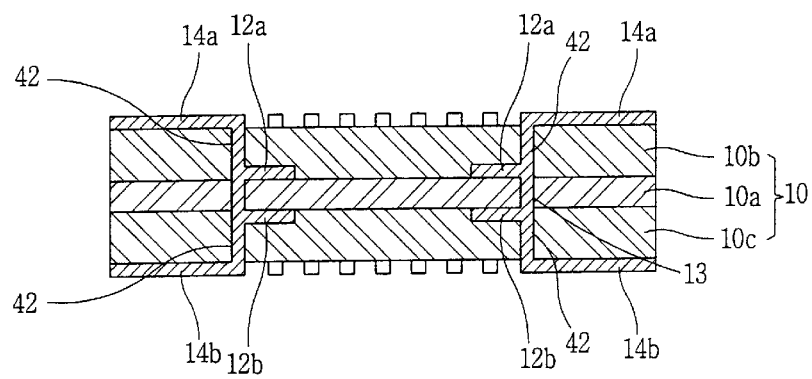

As shown in FIG. 3E, the first and second upper conductive lines 12a, 14a are electrically connected, respectively, and the first and second lower conductive lines 12b, 14b are electrically connected, respectively. For connecting each of the corresponding first and second conductive lines 12a, 12b, 14a, 14b, through-holes are formed in the upper and lower second insulating layers 10b, 10c, so that the first upper and lower conductive lines 12a, 12b are exposed. The through-holes are filled with a conductive metal 42 (such as aluminum, lead, copper or tungsten), which electrically connects the first conductive lines 12a, 12b with the corresponding second conductive lines 14a, 14b, respectively.

In FIG. 3E, the optional conductive plugs 13, for electrically connecting the upper and lower first conductors 12a, 12b together, respectively, have been depicted. It should be recalled that such plugs 13 need not be formed, i.e., the upper first conductor 12a can remain electrically insulated from the lower first conductor 12b.

Figure 3F:
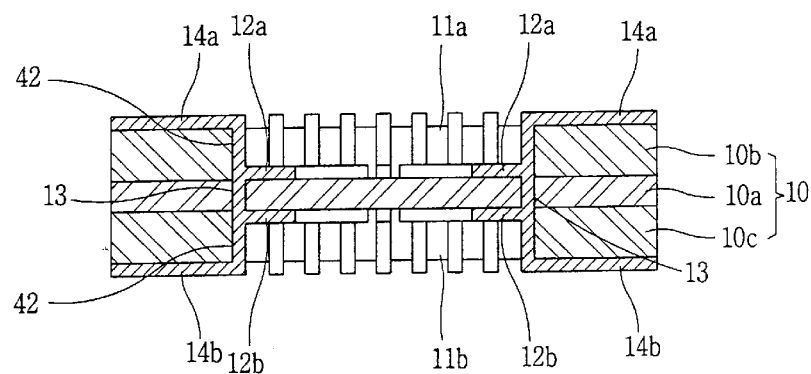

Then, as shown in FIG. 3F, the central portions of the second upper and lower insulating layers 10b, 10c are removed, e.g., ground or etched, down to about the surface of the first insulating layer 10a, that is, at least until the first upper and lower conductive lines 12a, 12b are exposed, but it is preferred also to expose the layer 10a a so that the lines 12a, 12b are fully exposed. As a result, the upper and lower recesses 11a, 11b are formed to have a size appropriate for mounting a semiconductor chip (not illustrated) therein.

Figure 3G:
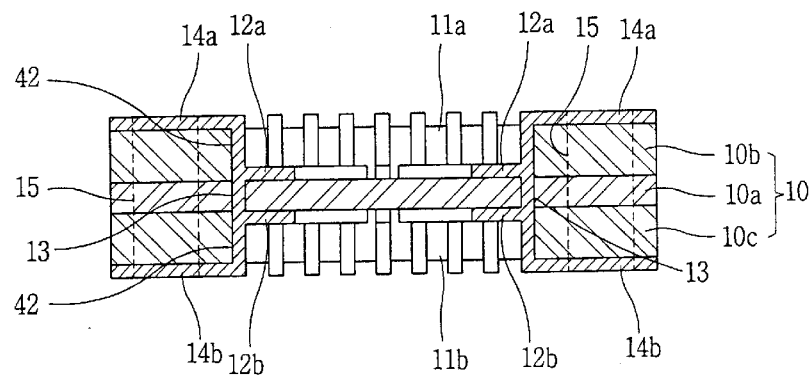

Then, as shown in FIG. 3G alignment holes 15, that vertically and completely penetrate the insulator body 10 are formed in the second lower insulating layer 10c, the first insulating layer 10a and the second upper insulating layer 10c. The alignment holes 15 are formed so as to align each substrate when plural substrates according to the present invention are stacked.

Figure 4A:
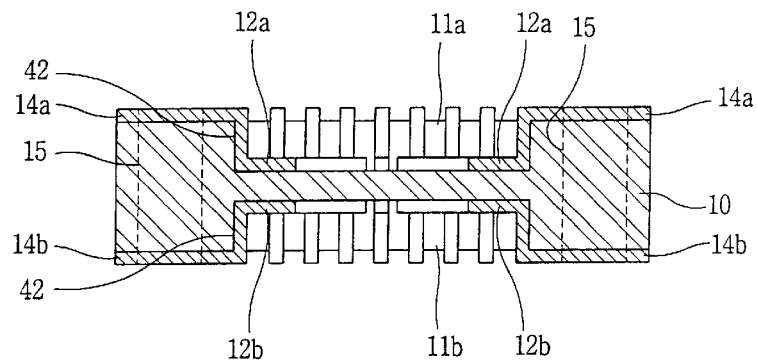
FIGS. 4A through 4D are longitudinal cross-sectional views showing a fabrication method for a stacked type semiconductor package according to an embodiment of the present invention.

FIGS. 4A through 4D are longitudinal cross-sectional views showing the fabrication method for a stacked-type semiconductor package according to an embodiment of the present invention. As shown in FIG. 4A, a substrate according to the present invention is prepared, e.g., as in FIGS. 3A–3G. The substrate in FIG. 3A is identical to that of the present invention shown in FIG. 2C-1, i.e., it does not include the optional metal plugs 13.

Figure 4B:
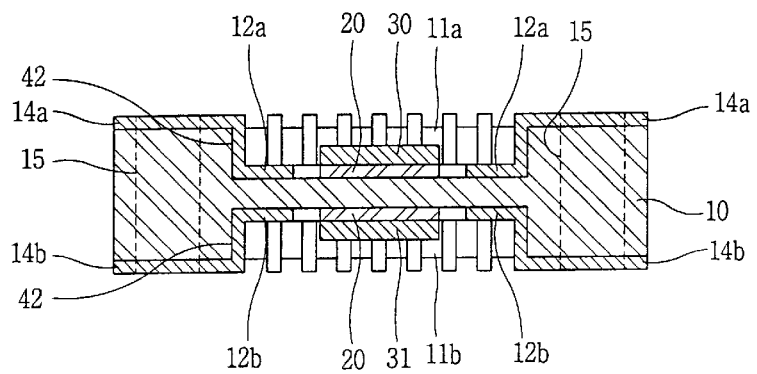
Figure 4C:
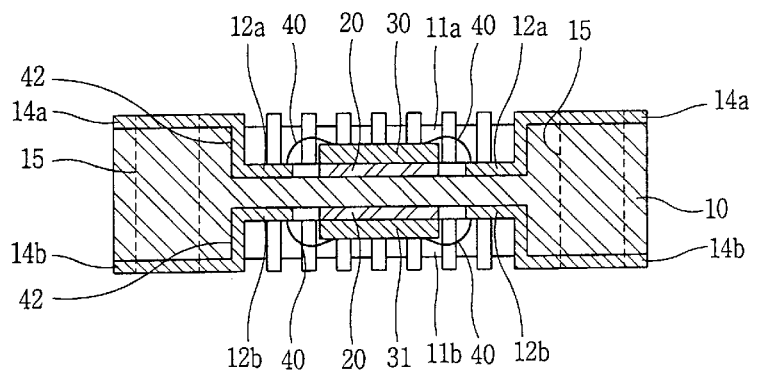

Then, as shown in FIG. 4B, semiconductor chips or devices, e.g., integrated circuit, 30, 31 are attached on the bottom surfaces of the upper and lower recesses of the substrate using bonding members 20, e.g., using an adhesive tape, paste or epoxy. If depicted in FIGS. 2A and 2B, the bonding member 20 would be located in the center of the bottoms of the recesses, respectively. Depending upon the material used, the bonding member 20 might extrude between the conducting layer 12a, 12b, respectively. As shown in FIG. 4C, using a third conductive line 40 as a medium, the pads (not shown) of the upper and lower semiconductor chips 30, 31 and the corresponding ones of the first upper and lower conductive lines 12a, 12b are electrically connected, respectively.

Figure 4D:
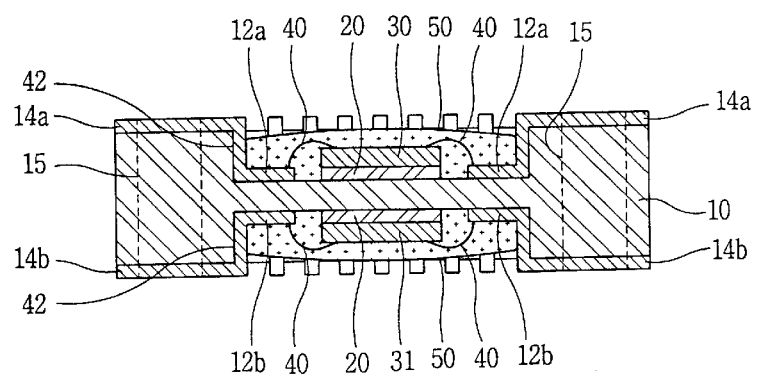

Then, as shown in FIG. 4D, a sealant, e.g., an epoxy molding resin, is used to fill in the upper and lower recesses 11a, 11b to form epoxy moldings 50 for sealing the upper and lower semiconductor chips 30, 31, the third conductive lines 40 and the first upper and lower conductive lines 12a, 12b. This completes the fabrication of the stacked-type semiconductor package according to the present invention.

In FIGS. 4A through 4D, the third conductive lines 40 are depicted, e.g., using bonding wire. Alternatives, such as a bump or a solder ball, can be employed as a material for the third conductive lines 40.

Figure 5:
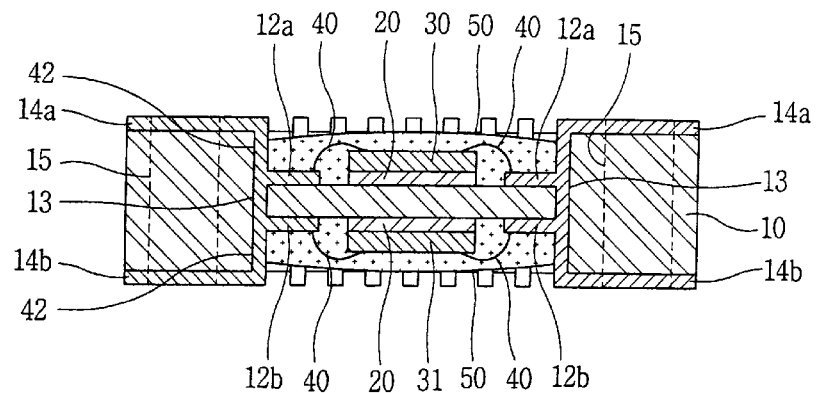
FIG. 5 is a longitudinal cross-sectional view showing a stacked type semiconductor package according to another embodiment of the present invention.

FIG. 5 is a longitudinal cross-sectional view showing a stacked-type semiconductor package according to another embodiment of the present invention. This embodiment uses the substrate, e.g., fabricated according to FIGS. 3A–3G, on which corresponding ones of the first upper and lower conductive lines 12a, 12b are electrically connected because the optional conductive metal plugs 13 have been included, as shown in FIG. 2C-2.

Figure 6:
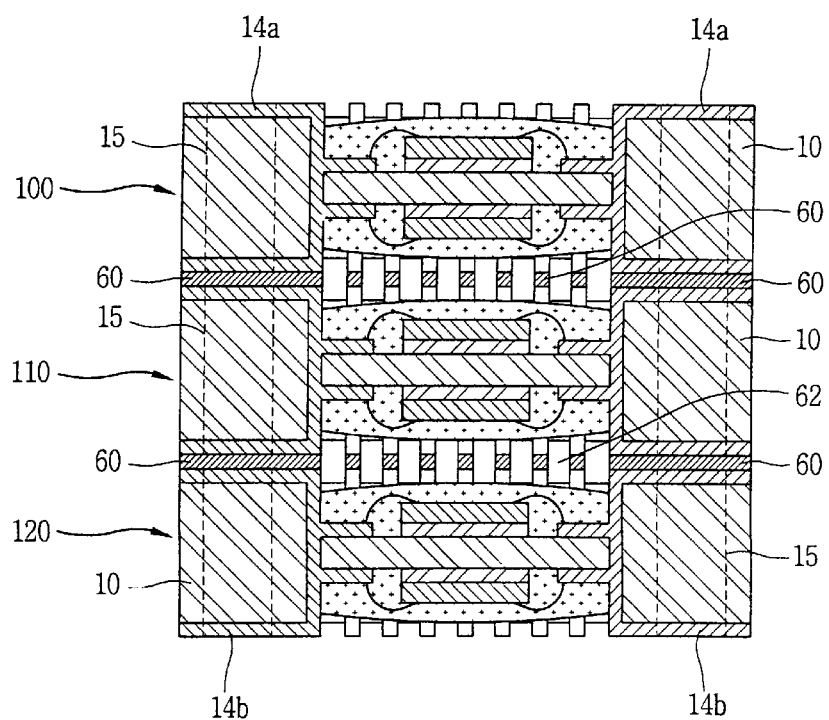
FIG. 6 is a longitudinal cross-sectional view showing a stacked state of a stacked type semiconductor package according to the present invention.

FIG. 6 is a longitudinal cross-sectional view showing a state in which a plurality of stacked-type semiconductor packages according to the present invention have been stacked upon each other. As shown in this drawing, a conductive solder paste 60, for example, is applied on the second upper and lower conductive lines 14a, 14b of the semiconductor package 100, and then, the semiconductor packages 100, 110, 120 are stacked and attached (adhered) using the solder paste 60 as a bonding medium. Voids 62, e.g., filled with air, remain unfilled by the paste 60.

In the above-described stacking process, the semiconductor packages 100, 110, 120 are vertically aligned with one another by using the alignment holes 15 which are formed in each semiconductor packages 100, 110, 120 and then attached in a stacked arrangement. The stacked-type semiconductor package according to the present invention achieves high integration by stacking a plurality of semiconductor packages, depending on the user's purpose.

As described in detail above, according to the present invention, a substrate for a semiconductor package on which two semiconductor chips can be installed in a single package and a fabrication method thereof is provided. This achieves a higher degree of integration and a thinning of the package. Further integration can be achieved by stacking the completed semiconductor packages (that have been formed according to the present invention).

Although the exemplary embodiments of the present invention have been disclosed for illustrative purposes, those skilled in the art will appreciate that various modifications and changes (additions and/or substitutions) are possible, without departing from the scope and spirit of the invention as included within the scope of the accompanying claims.

What is claimed is:

1. A substrate for a semiconductor chip package, the substrate comprising:
   a single insulator body having top and bottom surfaces, upper and lower recesses being respectively defined in said top and bottom surfaces of said single insulator body;
   a plurality of first upper and lower conductive lines, said first upper and lower conductive lines are located directly above each other, and are positioned at least in part on an exposed surface of said upper and lower recesses, respectively, wherein said first upper and lower conductive lines are electrically isolated from each other; and
   a plurality of second upper and lower conductive lines being respectively positioned at least in part on said top and bottom surfaces of said single insulator body and being respectively connected with corresponding ones of said first upper and lower conductive lines, said second upper and lower conductive lines extending outwardly from said upper and lower recesses, respectively.

2. The substrate of claim 1, wherein said single insulator body is one of ceramic and plastic.

3. The substrate of claim 1, wherein at least one alignment hole is formed in substrate.

4. The substrate of claim 1, wherein said first and second conductive lines are one of aluminum, lead, copper and tungsten.

5. The substrate of claim 1, wherein:
   said single insulator body includes
      a first insulating layer having a top and bottom surface, and
      upper and lower second insulating layers stacked against said top and bottom surfaces of said first insulating layer, respectively;
   said first upper and lower conductive lines being formed at least in part between said first insulating layer and said upper and lower second insulating layers, respectively; and
   said second upper and lower conductive lines being formed at least in part on outer surfaces of said upper and lower second insulating layers.

6. The substrate of claim 5, wherein said recesses are formed in said upper and lower second insulating layers to expose said upper and lower first conductive lines.

7. The substrate of claim 1, wherein the single insulator body includes multiple stacked layers that are fused together.

8. The substrate of claim 1, wherein the single insulator body includes multiple stacked layers that are bonded together.

9. A stacked type semiconductor chip package, comprising:
   a single insulator body having top and bottom surface;
   upper and lower recesses respectively formed in said top and bottom surface of said single insulator body;
   a plurality of first upper and lower conductive lines, said first upper and lower conductive lines are located directly above each other, and are formed respectively at least in part on exposed surface of said upper and lower recesses, respectively, wherein said plurality of first upper conductive lines are electrically isolated from corresponding said plurality of first lower conductive lines;
   a plurality of second upper and lower conductive lines respectively formed at least in part on said top and bottom surfaces of said single insulator body and connected with corresponding ones of the first upper and lower conductive lines, respectively, said second upper and lower conductive lines extending outwardly from said upper and lower recesses, respectively;
   first and second semiconductor chips respectively mounted in said upper and lower recesses;
   third conductive lines electrically connecting said first and second semiconductor chips to said first upper and lower conductive lines, respectively; and
   a sealant in said upper and lower recesses for sealing said first upper and lower conductive lines, said semiconductor chips and said third conductive lines, respectively.

10. The package of claim 9, wherein said single insulator body is one of ceramic and plastic.

11. The package of claim 9, wherein at least one alignment hole is formed in said single insulator body.

12. The package of claim 9, wherein said first and second conductive lines are one of aluminum, lead, copper and tungsten.

13. The package of claim 9, wherein each said third conductive line is one of a wire, bump, and a solder ball.

14. The package of claim 9, wherein:
   said single insulator body includes
      a first insulating layer having a top and bottom surface, and upper and lower second insulating layers stacked against said top and bottom surfaces of said first insulating layer;

said first upper and lower conductive lines being formed at least in part between said first insulating layer and said upper and lower second insulating layers, respectively; and said second upper and lower conductive lines being formed at least in part on outer surfaces of said upper and lower second insulating layers.

15. The package of claim 14, wherein said recesses are formed in said upper and lower layers to expose said upper and lower first conductive lines.

16. The package of claim 9, wherein said sealant is a molding resin.

17. The package of claim 9, wherein the single insulator body includes multiple stacked layers that are fused together.

18. The package of claim 9, wherein the single insulator body includes multiple stacked layers that are bonded together.

19. An assembly of stacked semiconductor chip packages, the assembly comprising:

at least two semiconductor chip packages, each including:
a single insulator body having top and bottom surfaces, upper and lower recesses being respectively defined in said top and bottom surfaces of said single insulator body;

a plurality of first upper and lower conductive lines, said first upper and lower conductive lines are located directly above each other, and are positioned at least in part on an exposed surface of said upper and lower recesses, respectively, wherein said first upper and lower conductive lines are electrically isolated from each other;

a plurality of second upper and lower conductive lines being respectively positioned at least in part on said top and bottom surfaces of said single insulator body and being respectively connected with corresponding ones of the first upper and lower conductive lines, said second upper and lower conductive lines extending outwardly from said upper and lower recesses, respectively;

first and second semiconductor chips respectively mounted in said upper and lower recesses;

third conductive lines electrically connecting said first and second semiconductor chips to said first upper and lower conductive lines, respectively; and a sealant in said upper and lower recesses for sealing said first upper and lower conductive lines, said semiconductor chips and said third conductive lines respectively; and electrically conductive material coupling corresponding upper and lower second conductive lines of said at least two packages, respectively.

20. The assembly recited by claim 19, wherein said electrically conductive material fixes said corresponding upper and lower second conductive lines of said at least two packages, respectively.

21. The assembly of claim 19, wherein the single insulator body includes multiple stacked layers that are fused together.

22. The assembly of claim 19, wherein the single insulator body includes multiple stacked layers that are bonded together.

* * * * *